United States Patent [19]
Dixon

[11] 3,777,225
[45] Dec. 4, 1973

[54] LOW POWER LIGHT CONTROLLED SWITCHING DEVICE

[76] Inventor: Lester A. Dixon, 5731 Castle Dr., Huntington Beach, Calif.

[22] Filed: Apr. 24, 1972

[21] Appl. No.: 246,991

[52] U.S. Cl. .............. 317/130, 250/214 D, 315/159
[51] Int. Cl.. H01h 47/24, H05b 37/02, H05b 39/04
[58] Field of Search ................ 315/159; 250/214 D; 317/130

[56] References Cited

UNITED STATES PATENTS 3,319,116 5/1967 Schick .......................... 317/130 X

*Primary Examiner*—James W. Lawrence
*Assistant Examiner*—T. N. Grigsby
*Attorney*—Edward E. Roberts

[57] ABSTRACT

A low current photosensitive sensing arrangement is exposed to a light environment. If light conditions cause the light level to increase above a preselected intensity, the arrangement operates automatically to activate the electronic circuits attached thereto. If the light level decreases below the preselected intensity, the arrangement automatically deactivates the electronic circuits attached thereto.

9 Claims, 1 Drawing Figure

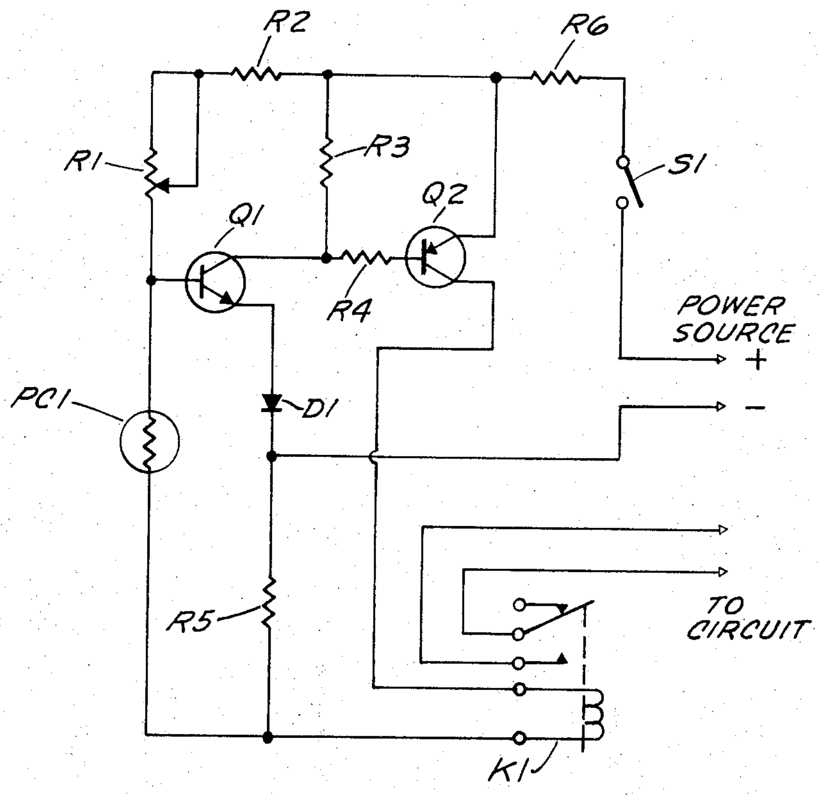
R2
R6
R1
R3
S1
Q1
Q2
R4
POWER SOURCE
+
−
PC1
D1
R5
TO CIRCUIT
K1

LOW POWER LIGHT CONTROLLED SWITCHING DEVICE

BACKGROUND OF THE INVENTION

1. Field of the Invention

The invention relates to new and useful improvements in switching devices and relates particularly to transistorized circuitry including a photocell arrangement responsive to preselected light intensities to provide switching of electronic circuits commonly found in automobiles.

2. Description of Prior Art

Various arrangements have been proposed for the automatic switching of electrical circuits in response to illumination levels; but for some reason, none of the proposed systems have met with any commercial success in the automotive field. The prior controls have usually required more than one relay or switch and the photocells, usually of the selenium resistance type, and/or relays have imposed an objectionable level of continuous current drain on the automobile battery. The wiring systems for associating the prior automatic controls with the customary circuits of the automobile have been relatively complicated and the placing of equipment such as relays, resistors, etc., back of the panel board has been difficult and inconvenient. In most instances there has been the further objection that it was necessary to make comparatively extensive changes in the original wiring of the automobile wiring system.

SUMMARY OF THE INVENTION

Briefly, the low power light control switching device comprises at least one photocell with associated transistorized electrical circuitry wherein when a preselective light level is sensed by the photocell a relay is operated to provide electrical continuity for electrical circuits.

In the preferred embodiment, a photocell with associated electronic circuitry is provided to establish continuity to activate other electrical circuits whenever the photocell senses a preselected light level indicative of daylight. This circuit operates to render the invention inoperative during nighttime hours.

It is therefore an object of this invention to provide a new and useful improvement in electrical switching devices.

It is another object of the present invention to provide a device responsive to preselected light intensities to provide switching of electrical circuits.

It is another object of this invention to provide a photocell arrangement with associated transistorized electronic circuitry wherein the photocell circuit is responsive to preselected light intensities to provide activation of electrical circuitry and responsive to removal of the preselected light intensity to deactivate the electrical circuitry.

These and additional objects will become more apparent when taken in conjunction with the following description and drawings in which like characters indicate like parts.

BRIEF DESCRIPTION OF THE DRAWINGS

The FIGURE illustrates a schematic diagram of the invention.

DESCRIPTION OF THE PREFERRED EMBODIMENT

Referring to the FIGURE, there is shown photocell PC1, NPN transistor Q1, PNP transistor Q2, resistors R1 through R6, relay K1, diode D1, and switch S1. The collector of transistor Q1 is connected to the base of transistor Q2 by resistor R4. The emitter of transistor Q2 is connected to one side of power switch S1 through voltage dropping resistor R6. The other side of power switch S1 is connected to the positive terminal of a 12 volt DC power source. If a 6 volt power source is used, voltage dropping resistor R6 is not required.

Diode D1 is provided to protect transistor Q1 in case of improper hookup (reverse polarity of the power source) and connects the emitter of transistor Q1 to the negative terminal of the twelve volt DC power source.

One terminal of photocell PC1 is connected to the base of transistor Q1. The other terminal of photocell PC1 is connected through bias resistor R5 to the negative terminal of the twelve volt DC power source and also connected through the coil of relay K1 to the collector of transistor Q2.

The emitter of transistor Q2 is connected to the collector of transistor Q1 by means of bias resistor R3. One terminal of potentiometer R1 is connected to the base of transistor Q1. The other terminal of potentiometer R1 is connected to the slider contact of the potentiometer and also connected to the emitter of transistor Q2 by means of voltage divider resistor R2.

The center, or selector terminal of normally closed relay K1 is connected to a first terminal of the electric circuit to be activated. The normally open contact of relay K1 is not connected to the circuit. The normally closed contact of relay K1 is connected to a second terminal of the circuit to be activated.

The circuit operates in the following manner: assuming the presence of the preselected illumination photocell PC1 senses the illumination and the resistance of the photocell is thereby decreased. This reduction in resistance decreases the voltage drop across the photocell and bias resistor R5 resulting in the base of transistor Q1 becoming less positive. This decrease in positive voltage at the base of NPN transistor P1 operates to turn off Q1 with the result that the collector of Q1 is less negative (more positive) since the collector/emitter voltage drop across the transistor has increased. With the collector of transistor Q1 becoming more positive, the base of PNP transistor Q2 becomes more positive through coupling resistor R4 resulting in turn-off of transistor Q2. Turn-off of transistor Q2 removes current from the coil of relay K1 resulting in normally closed relay K1 providing continuity of the electrical circuit through relay K1.

Conversely, without presence of the preselected illumination, the resistance of photocell PC1 is increased resulting in an increase in positive voltage at the base of NPN transistor Q1 operating to turn on transistor Q1. When transistor Q1 begins to conduct, the collector of transistor Q1 assumes a more negative potential resulting in the base of PNP transistor Q2 assuming a more negative potential through coupling resistor R4 which causes transistor Q2 to turn on. Turn on of transistor Q2 causes energization of relay K1 to remove continuity of the electric circuit through relay K1.

The sensitivity to illumination of photocell PC1 can be adjusted by the potentiometer R1. It is necessary of course that photocell PC1 be appropriately mounted to be exposed to the preselected illumination.

Typical component values are as follows:

| | |
|---|---|
| Potentiometer R1 | Kilohms 100.0 |
| Resistor R3 | Kilohms 2.7 |
| Resistor R2 | Kilohms 1.0 |
| Resistor R4 | Ohms 330.0 |
| Resistor R6 | Ohms 68.0 |
| Resistor R5 | Ohms 2.7 |
| Diode D1 | 1N569 |
| Transistor Q1 | NPN 2N1304 |
| Transistor Q2 | PNP 2N2004 |
| Relay K1 | 440 Ohms, 6 Volts DC |
| Photocell PC1 | Max. Resistance 5 Megohms Min. Resistance 100 Ohms Where the NPN transistor has been shown, it may be replaced with a PNP transistor, and vice versa, with appropriate changes in circuitry to provide for the different polarities. |

There has been shown a switching device for electrical circuits which will stand in readiness on a minimum of power to automatically activate electrical circuits in response to sensing a preselected intensity of illumination and will automatically deactivate the circuits during periods when the preselected illumination is absent.

The specific embodiment shown and discussed has been shown to illustrate the principles of the invention. It is to be clearly understood that the same is by way of illustration and example only and is not taken by way of limitation; the spirit and scope of this invention being limited only by the terms of the appended claims.

I claim:

1. A device for switching electrical apparatus comprising:

photocell means, a voltage source, disconnect means, and first and second transistor means having mutually opposite polarity;

coupling resistor means connecting the collector of said first transistor means to the base of said second transistor means;

resistor means connecting the collector of said first transistor means to the emitter of said second transistor means;

means for connecting said emitter of said second transistor to the positive terminal of said voltage source;

resistor means connecting the emitter of said first transistor means to a first terminal of said photocell and further to a first terminal of said disconnect means;

means for connecting the emitter of said first transistor means to the negative terminal of said voltage source;

resistor means for connecting the base of said first transistor means to the emitter of said second transistor means;

means for connecting the collector of said second transistor means to a second terminal of said disconnect means;

means for connecting the base of said first transistor means to a second terminal of said photocell, said photocell responding to a preselected illumination level to turn off said first and second transistor means to thereby provide that said disconnect means switches on said electrical apparatus, and responding to the absence of said level to turn on said first and second transistor means to thereby provide that said disconnect means switches off said electrical apparatus.

2. The invention of claim 1 wherein said resistor means for connecting the base of said first transistor means to the emitter of said second transistor is a variable resistor whereby the magnitude of said illumination level is varied.

3. The invention of claim 1 wherein circuit protection diode means is connected between the emitter of said first transistor and the negative terminal of said voltage source.

4. The invention of claim 1 wherein voltage dropping resistance means is connected between the emitter of said second transistor means and said positive terminal of said voltage source.

5. Illumination detection device for switching electrical apparatus comprising:

a photocell and a first and a second transistor;

a first resistor connecting the collector of said first transistor to the base of said second transistor;

a direct current voltage source;

a second resistor connecting the emitter of said second transistor to the positive terminal of said voltage source;

a diode connecting the emitter of said first transistor to the negative terminal of said voltage source;

a third resistor connecting said collector of said first transistor to said emitter of said second transistor;

a fourth resistor connecting a first terminal of said photocell to said negative terminal of said voltage source;

a fifth resistor having a first terminal connected to said emitter of said second transistor;

a potentiometer with a first terminal connected to the base of said first transistor and a second terminal connected to a second terminal of said fifth resistor;

said potentiometer having a selector tap for varying the resistance of said potentiometer connected between said potentiometer and said fifth resistor;

a normally closed relay, the coil of said relay connecting the collector of said second transistor to said first terminal of said photocell;

said second terminal of said photocell connected to the base of said first transistor;

said relay having a selector contact connected to a first terminal of said electrical apparatus; and said relay having a normally closed contact connected to a second terminal of said electrical apparatus.

6. The invention in claim 5 wherein said diode is bypassed and omitted.

7. The invention of claim 5 wherein said second resistor is a variable voltage dropping resistor for matching said device to said voltage source.

8. The invention of claim 5 wherein said fifth resistor and said potentiometer are replaced by a second potentiometer.

9. The invention in claim 8 wherein said second potentiometer is replaced with a seventh resistor.

* * * * *